United States Patent
Aoust et al.

(10) Patent No.: US 10,809,230 B2
(45) Date of Patent: Oct. 20, 2020

(54) MECHANICAL RESONATOR OPTIMISED TO OPERATE IN A FLUID

(71) Applicant: OFFICE NATIONAL D'ETUDES ET DE RECHERCHES AÉROSPATIALES, Palaiseau (FR)

(72) Inventors: Guillaume Aoust, Saint Arcons d'Allier (FR); Béatrice Bourgeteau, Issy les Moulineaux (FR); Raphaël Levy, Paris (FR); Olivier Le Traon, Vauhallan (FR); Denis Janiaud, Les Ulis (FR)

(73) Assignee: OFFICE NATIONAL D'ETUDES ET DE RECHERCHES AÉROSPATIALES, Palaiseau (FR)

( * ) Notice: Subject to any disclaimer, the term of this patent is extended or adjusted under 35 U.S.C. 154(b) by 0 days.

(21) Appl. No.: 16/321,162

(22) PCT Filed: Jul. 6, 2017

(86) PCT No.: PCT/FR2017/051850
§ 371 (c)(1),
(2) Date: Jan. 28, 2019

(87) PCT Pub. No.: WO2018/020096
PCT Pub. Date: Feb. 1, 2018

(65) Prior Publication Data
US 2019/0162701 A1     May 30, 2019

(30) Foreign Application Priority Data

Jul. 27, 2016  (FR) ...................................... 16 01154

(51) Int. Cl.
*H03B 5/32* (2006.01)
*H03H 9/215* (2006.01)
(Continued)

(52) U.S. Cl.
CPC ......... *G01N 29/022* (2013.01); *G01N 29/036* (2013.01); *H03B 5/32* (2013.01);
(Continued)

(58) Field of Classification Search
CPC ............... G01N 29/022; G01N 29/036; G01N 2291/0255; G01N 2291/0256;
(Continued)

(56) References Cited

U.S. PATENT DOCUMENTS

| 4,072,915 A | 2/1978 | Mitchell |
| 4,429,248 A | 1/1984 | Chuang |

(Continued)

FOREIGN PATENT DOCUMENTS

| EP | 0 101 669 A2 | 2/1984 |
| FR | 2 325 243 A1 | 4/1977 |

(Continued)

OTHER PUBLICATIONS

Aoust Guillaume et al: "Shape optimization for high quality factor flexural mechanical resonators operated in air", 2016 Symposium on Design, Test, Integration and Packaging of MEMS/MOEMS (DTIP), IEEE, May 30, 2016 (May 30, 2016), pp. 1-4, XP032925540, DOI: 10.1109/DTIP.2016.7514840.

(Continued)

*Primary Examiner* — Levi Gannon
(74) *Attorney, Agent, or Firm* — Nixon & Vanderhye

(57) ABSTRACT

A resonator includes a prong of which the width between edges is close to λ/2. The pressure variation at one edge is then in phase opposition with that at the other edge. Acoustic coupling with an incident wave having the wavelength is thus improved. The ratio between the width between edges and the height of the prong is chosen so that only the fundamental mode with bending oscillation of the prong is present. It to prongs of a tuning fork embedded in a solid (Continued)

shared base optimized to contain the energy in the tuning fork while avoiding energy losses in the support. Finally, the tuning fork is advantageously combined with a unit for containing acoustic energy including a rigid reflecting screen.

16 Claims, 5 Drawing Sheets

(51) Int. Cl.
*G01N 29/036* (2006.01)
*G01N 29/02* (2006.01)
*H03H 9/19* (2006.01)

(52) U.S. Cl.
CPC .............. *H03H 9/19* (2013.01); *H03H 9/215* (2013.01); *G01N 2291/0255* (2013.01); *G01N 2291/0256* (2013.01); *G01N 2291/02809* (2013.01); *G01N 2291/0427* (2013.01)

(58) Field of Classification Search
CPC . G01N 2291/02809; G01N 2291/0427; H03B 5/30; H03B 5/32; H03H 9/19; H03H 9/21; H03H 9/215; H03H 9/2468; H03H 9/2473; H03H 9/2478; H03H 9/2484; H03H 9/2489; H03H 9/2494; H03H 2003/026; H03H 2003/0492

USPC .................................. 310/370; 331/154, 156
See application file for complete search history.

(56) References Cited

U.S. PATENT DOCUMENTS

| 7,193,352 | B1* | 3/2007 | Ballato ................ G01N 29/022 |
| | | | 310/320 |
| 8,978,473 | B2 | 3/2015 | Le Traon et al. |
| 2013/0147568 | A1* | 6/2013 | Huang ................ H03H 9/02259 |
| | | | 331/156 |
| 2019/0170631 | A1* | 6/2019 | Shachar ............. G01N 15/0606 |

FOREIGN PATENT DOCUMENTS

FR 2 954 489 A1 6/2011
WO 2006/107900 A2 2/1984

OTHER PUBLICATIONS

International Search Report, dated Aug. 22, 2017, from corresponding PCT/FR2017/051850 application.
Kosterev, A.A. et al., "Quartz-enhanced photoacoustic spectroscopy," Optics Letters, vol. 27, No. 21, Nov. 1, 2002, pp. 1902-1904.
Lochon, F. et al., "A microcantilever chemical sensors optimization by taking into account losses," Sensors and Actuators B: Chemical, Elsevier, 2006, 118, pp. 292-296.

* cited by examiner

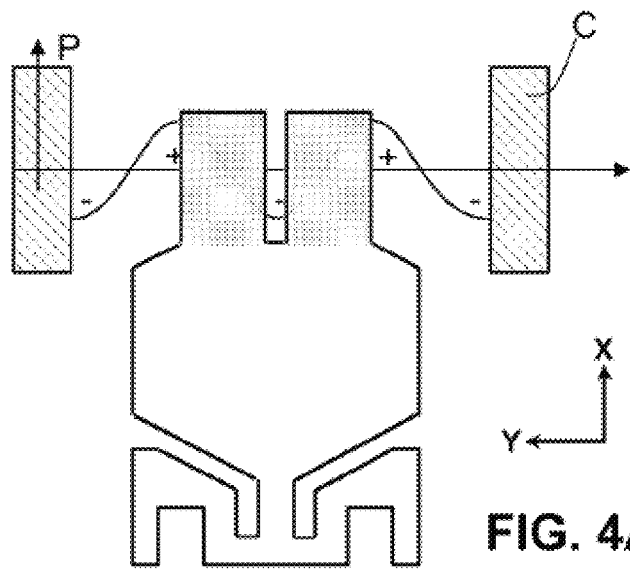
FIG. 4A
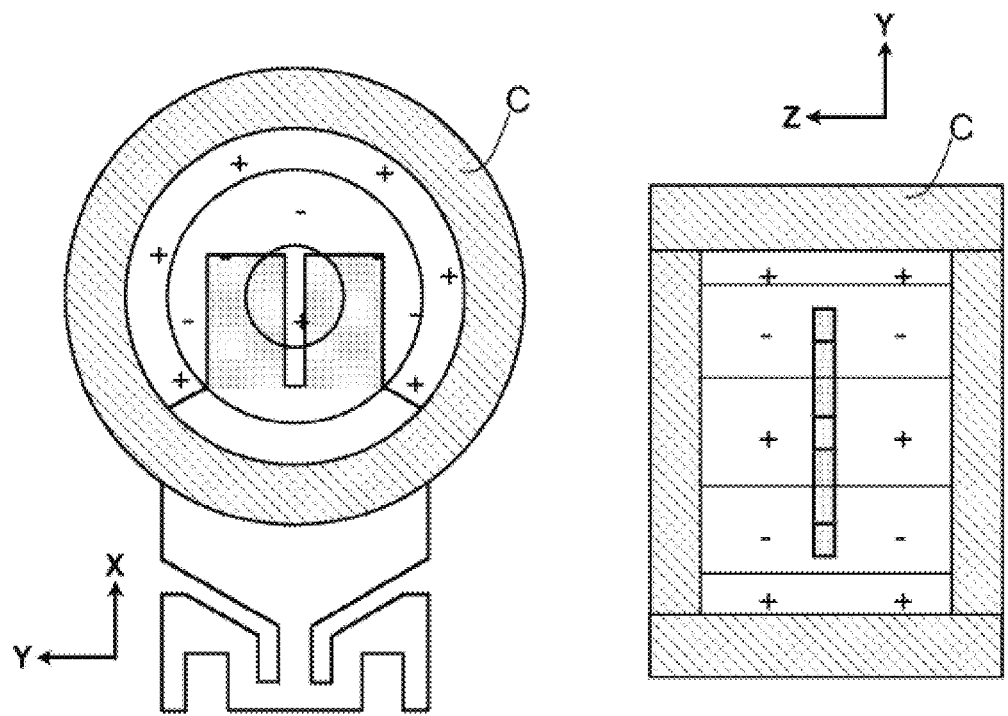
FIG. 4B
FIG. 4C

MECHANICAL RESONATOR OPTIMISED TO OPERATE IN A FLUID

The technical field of the invention is that of mechanical resonators intended to be integrated into measurement instruments, particularly instruments detecting the presence of chemical elements in the atmosphere and measuring their concentration.

BACKGROUND OF THE INVENTION

The resonator is the sensitive element of the instrument. The frequency, stability, and quality of the resonance are related to the dimensions, geometry, component material, and environment of the resonator. Resonance is maintained by external means.

The quality factor of a resonator is defined as the ratio between the energy stored in the resonator in the form of kinetic energy and deformation potential, and the energy lost during one oscillation cycle.

One of the best known mechanical resonators is the quartz tuning fork used in the watchmaking industry. Resonance is maintained by a tuned electronic circuit, but it is the quality of the mechanical resonance of the two prongs of the tuning fork that ensures the stability and purity of the resonance frequency.

As this resonator is encapsulated in a housing where a vacuum has been created, the energy is essentially lost to the securing support.

FIG. 1 illustrates an exemplary timepiece resonator created in a quartz plate of thickness T=0.2 mm. The tuning fork is formed by two identical parallel parallelepipedic prongs 1 which are integral at one of their ends with a shared portion 2 fixed to the support. The tuning fork is thus symmetrical with respect to the center plane Π. The dimensions of the prongs in the plane of the plate are: length Lb=3.8 mm and width Wb=0.6 mm.

To facilitate machining, the width Ws of the slot between the prongs is 0.2 mm, in other words equal to the thickness T of the plate.

The slenderness ratio of a prong is defined as the ratio between its length Lb and its width Wb. Thus, in the example shown, the slenderness ratio is about 6.3.

At the mechanical resonance frequency of the timepiece tuning fork, which is 32.768 kHz, the two prongs vibrate in phase opposition by bending in the plane of the plate. The slenderness ratio is large enough that the mechanical stresses are essentially alternating expansion and compression stresses distributed over the length of the prongs, but they have little presence in the shared portion where they attenuate quickly, which reduces energy losses when the area of attachment to the base is at a distance from the prong embedding area. The quality factor of such a resonator is thus typically about 80,000.

A tuned external electronic circuit maintains the resonance by means of electrodes arranged in an appropriate and known manner on the prongs.

The controlled implementation and low production cost of these resonators incentivizes their use in technical fields other than timepieces, such as metrology.

Resonators of this type are used in applications for measuring physical quantities: prong deformations, for example induced by acceleration or rotation, are detected by electrodes which, in addition to their function of exciting a resonance mode, called drive mode, may have a function of detecting a resonance mode, called detector mode, modified by varying the relevant physical value (FR2954489).

These resonators are also used in the presence of a fluid, generally a gas or a gas mixture such as the earth's atmosphere for example.

The presence of a fluid changes the energy losses in the resonator. In addition to losses in the securing support, losses appear which are related to the viscous friction of the prongs with the fluid and an acoustic coupling related to pressure variations of the fluid which are generated by the motion of the prongs.

The state of the art in this field includes the use of timepiece tuning forks for the measurement technique called Quartz-Enhanced Photoacoustic Spectroscopy (QEPAS) introduced in the article entitled "Quartz-enhanced Photoacoustic spectroscopy", A. A. Kosterev et al, OPTICS LETTERS/Vol. 27, No. 21/Nov. 1, 2002.

The acoustic wave is the external medium which maintains the resonance of the tuning fork. The wave travels at a constant speed c in a given fluid if the temperature and the pressure P are constant. In the earth's atmosphere under normal conditions of pressure and temperature, the speed of sound is about 340 m/s.

Finally, the wavelength $\lambda$ of sound is related to its frequency f and to the propagation speed c by the following relation:

$$\lambda = c/f \quad (R)$$

The authors of the article point out that the timepiece tuning fork is very easy to implement (procurement, cost), but its design is probably not optimized for the detection of a photoacoustic wave. They suggest that a resonator specially designed for this purpose should improve the sensitivity of the device, but give no further instructions (central paragraph of the last column of the article).

As most of the energy losses of such a resonator equal the sum of the losses into the support, the losses due to viscous friction, and the losses due to acoustic coupling, it makes sense to minimize each of these losses.

SUMMARY OF THE INVENTION

The invention aims to provide a resonator where the losses due to viscous friction and the losses into the support are minimized but where the acoustic losses are facilitated, and to associate this resonator with a medium able to restore its acoustic losses, this ensemble constituting an optimized device having low losses, including acoustic, therefore having a high quality factor.

The invention concerns a resonator comprising a prong of length Lb and width Wb, produced in a flat plate of thickness T integral at one and/or the other of its ends with a solid portion fixed to a support.

This prong has a resonance mode with bending in the plane of the plate at a frequency f. This resonance mode is excited in the presence of an acoustic wave originating from an external energy source, for example a laser beam modulated at frequency f that is partially absorbed while passing through the fluid as in the article cited above. Close to the beam, energy transfer from the laser to the fluid occurs at the modulation frequency f of the laser, creating an acoustic wave of wavelength $\lambda$.

It is known that, in relation (R), the speed c varies little with the frequency f of the acoustic wave and the pressure P of the fluid (for pressures greater than 10 Pa). Similarly, the speed c varies relatively little with the temperature at commonly encountered temperatures, meaning between −10° C. and +40° C.: c evolves as the square root of the absolute temperature if an ideal gas is assumed.

It is therefore possible to design a type of resonator having high sensitivity in many conditions of use while having defined dimensions, geometry, and component material.

Thus, the resonators according to the invention are mechanical resonators specially designed to facilitate the coupling with an incident acoustic wave and to be integrated into measurement instruments, particularly instruments measuring the presence of absorbent chemical elements in a fluid which can be the earth's atmosphere.

When the resonance mode is excited, the presence of the resonator offers relatively little interference with the acoustic wave which travels throughout the space surrounding the resonator. Therefore, the acoustic wave interacts not only on the face of the prong oriented towards the energy source or inner edge of the prong, but also on the opposite face or outer edge of the prong.

In the context of this description, edge is understood to mean a face along the thickness of the resonator, perpendicular to the plane of the plate, meaning it extends in the direction of the thickness of the plate for one of its face dimensions.

If the energy source is in the plane of the plate, but distanced from the prong on an axis perpendicularly intersecting its length Lb, the acoustic wave is considered to be flat when it acts on the edges of the prong. If the distance Wb between the two edges of the prong is equal to $\lambda/2$, the pressure variation on the inner edge of the prong will be in phase opposition with the pressure variation on the outer edge of the prong, resulting in synergy in the forces exerted by the acoustic wave on the prong. The periodic nature of the acoustic wave leads to theoretical optimized values of $\lambda/2+n\cdot\lambda$, n being a positive integer or zero.

This condition on the width Wb of the prong is necessary to obtaining a resonator of the invention.

If the energy source is not far field, the phase difference between the pressure variations on the prong edges is variable around $\Pi$. This leads to defining a range of values for the width Wb comprised between $\lambda/4+n\lambda$ and $3\lambda/4+n\lambda$, n being a positive integer or zero, where the synergy of the forces exerted by the acoustic wave on the prong edges is smaller but still exists.

A resonator according to the invention may have other improvements to improve its performance.

Thus, in one embodiment, the length of the prong is such that only the fundamental resonance mode with bending is possible, which limits its slenderness ratio.

For a prong embedded at both ends the slenderness ratio is comprised between 2 and 5, and for a prong embedded at one of its ends the slenderness ratio is between 1.2 and 3.6.

The slenderness ratio requirement does not depend on the absolute dimensions of the prongs, meaning that this requirement applies regardless of the value of Lb. On the other hand, the slenderness ratio requirement depends on the component material of the prong and on the surrounding fluid.

Such a prong conformation reduces energy losses due to the viscous friction of the prongs with the fluid.

Preferably, a resonator of the invention is a tuning fork having two parallel adjacent prongs embedded at one of their ends in a shared portion. As is known, the tuning fork allows better energy containment by reducing energy losses into the support.

Although in a timepiece tuning fork comprising two prongs having a slenderness ratio of about 6.3, the stresses are essentially alternating stresses of expansion and compression distributed along the length of the prongs and barely present at the embedding in the shared portion where they quickly attenuate, this is not the case when the tuning fork comprises prongs vibrating in a fluid such as air and having a slenderness ratio of about 2.3.

At the mechanical resonance frequency of the tuning fork, the two prongs vibrate by bending in phase opposition in the plane of the plate, but because of their low slenderness ratio, the mechanical stresses are alternating stresses of expansion/compression and shear at the embedding in the shared portion.

Modifying the stresses related to the slenderness ratio of the prongs of the resonators according to the invention leads to defining a particular conformation of the shared portion which makes it possible to reduce losses into the medium.

This solid shared portion has the shape of a rectangular parallelepiped whose length is more than twice the width of a prong and whose height is greater than the length of a prong. Solid is understood to mean bulky and not hollow. Arranged one on either side of this parallelepiped are two isosceles trapezoids whose large bases have a length equal to the length of the shared portion. The small base of one of the two isosceles trapezoids supports the prongs, the outer edges of the tuning fork prongs being coincident with the ends of this base. The smaller base of the other isosceles trapezoid supports the intermediate connection member joining the resonator to its support. The length of this second small base is much smaller than the length of the parallelepiped and is about half or one-third of the width of a prong, the surface area of the shared portion being approximately three times the surface area of the two prongs. As a result, the mass of the shared portion is about three times the mass of the two prongs, meaning comprised between 2 times and 4 times, or between 2.5 and 3.5 times, the mass of the two prongs.

The energy losses to the support are thus reduced in comparison to those of a timepiece resonator.

In its operation as envisaged in the invention, the optimized resonator is excited by an external energy source. The electrodes therefore only have a detection function.

As already described, the slenderness ratio of the prongs of the resonators according to the invention induces, in addition to bending stresses in the prongs, shear stresses in the embedding area on the shared portion.

The specific conformation of the electrodes is adapted to improve the detection, by piezoelectric effect, of vibrations of the resonator.

The electrodes have two polarities and cover, in the form of conductive pads, the entire surface of the two prongs and of the shared portion aside from the inter-electrode insulation areas.

The conformation of the electrodes is characteristic in that it concerns the prongs and the shared portion. Preferably, the electrodes of a same face parallel to the plane of the plate comprise:

a Y-shaped central electrode, having two symmetrical arms running alongside the inner edge faces of the two prongs which are facing one another, and having a tail connecting a central point of the intermediate connection member, two symmetrical external electrodes which each cover at least 25% of the portion of the face parallel to the plane of the plate that is part of the shared portion, each in a lateral area opposite to this shared portion, and which each connect a respective external point of the intermediate connection member, and two symmetrical intermediate electrodes, each having an arm which runs alongside an outer edge face of one of the prongs, a return portion which surrounds an end of one of the external electrodes opposite to the intermediate connection member, and a tail connecting a respective intermediate point of the intermediate connection member, between the central point and one of the external points.

It is possible to detect the vibration of the tuning fork by connecting a differential charge amplifier to the electrodes in order to generate a voltage representative of the amplitude of the vibration.

Beyond the particular conformation of a resonator according to the invention, a final improvement concerns restoring the energy lost due to the acoustic coupling between the resonator and its environment.

The invention therefore also relates to a device comprising a mechanical resonator according to the invention and an acoustic containment means arranged near the resonator and reflecting the acoustic energy emitted by the resonator.

This means is a resonant acoustic cavity, characterized in that:
- it has a natural frequency of acoustic resonance equal to the natural frequency of mechanical resonance of the tuning fork.
- the acoustic resonance mode at the natural frequency of acoustic resonance has nodes and antinodes such that each of the two inner edges of the resonator is located at a central antinode and that each of the outer edges is located within antinodes in phase opposition to the central antinode.
- to maximize the acoustic quality factor, the material of the cavity walls must be rigid.

A mechanical resonator according to our invention is therefore very well coupled to the acoustic mode because its dimensions are compatible with the acoustic wavelength, and therefore with the spatial distribution of the pressure mode.

BRIEF DESCRIPTION OF THE DRAWINGS

FIG. 4A illustrates the principle of a tuning fork equipped with its acoustic containment means, with a stationary pressure wave shown in 1D.

FIGS. 4B and 4C illustrate one of the possible shapes for the acoustic containment means, namely a cylindrical cavity viewed from the front and from above.

DETAILED DESCRIPTION OF THE PREFERRED EMBODIMENTS

Figure 1:
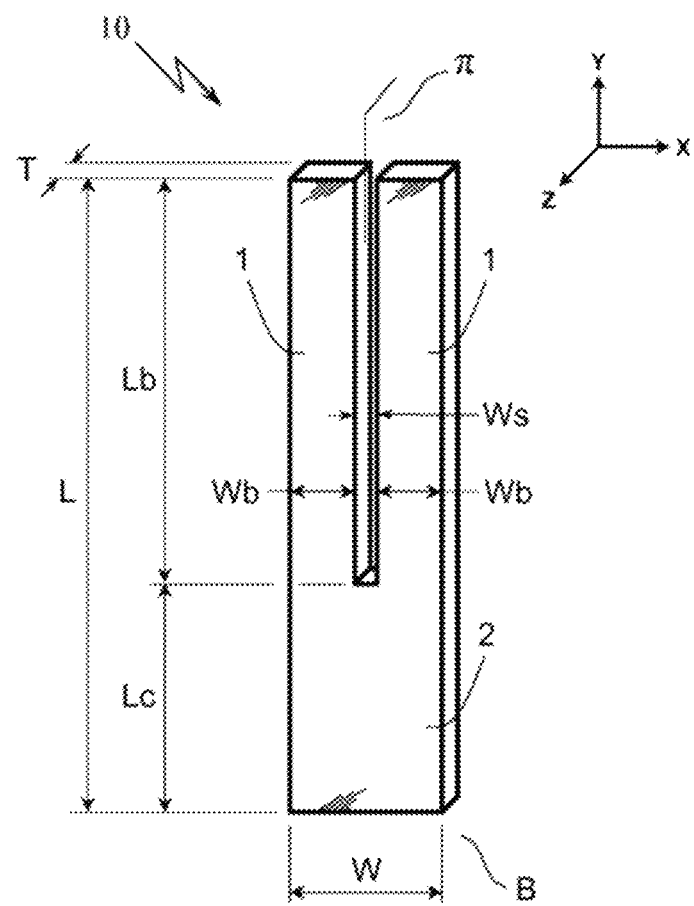
FIG. 1 illustrates a resonator of the prior art: a timepiece tuning fork.

The underlying idea of the invention is to define a simple object having high acoustic coupling in the usage conditions of resonators: shape, nature of the component material of the object, vibration mode, and nature of the fluid.

The selected object is an adapted parallelepipedic prong of length Lb', width Wb', and thickness T', of the type constituting a tuning fork prong of the prior art. It is made of a rigid material, for example quartz or silicon. The resonance vibration of the prong is a bending vibration in the plane defined by its length and width. The vibration modes are the fundamental mode and, optionally, the harmonic modes. The fluids are gases or mixtures of gases such as oxygen, nitrogen, carbon dioxide, carbon monoxide, hydrogen, helium.

The two faces defined by the length Lb' and the thickness T' of the prong are called edges.

The energy losses of a prong resonating under the usage conditions of the invention are of three types: acoustic losses, viscous losses, and losses into the support, the latter type of loss essentially being the only one encountered in timepiece resonators encapsulated in a vacuum if we ignore thermoelastic losses (Frederick Lochon, Isabelle Dufour, Dominique Rebiere, "A microcantilever chemical sensors optimization by taking into account losses". Sensors and Actuators B: Chemical, Elsevier, 2006, 118, pp 292-296).

The quality factor is a convenient means for expressing the influence of resonator losses. The quality factor of a resonator is defined as the ratio between the energy stored in the resonator in the form of kinetic energy and deformation potential, and the energy lost during an oscillation cycle.

The overall quality factor $Q_g$ of the resonator is defined by the formula:

$$1/Q_g = 1/Q_a + 1/Q_v + 1/Q_s$$

where
$Q_a$=acoustic quality factor
$Q_v$=viscous quality factor
$Q_s$=support quality factor This formula emphasizes that it is the lowest quality factor that degrades the overall quality factor, the optimal configuration being achieved when the quality factors are equal and as high as possible.

In contrast to this approach, the invention aims at define the dimensions of the prong in order to increase it acoustic coupling with the surrounding fluid. Consequently, the acoustic losses are significant, which goes against the teachings of the prior art.

The characterizing dimension of the invention is the width Wb' of the prong. In the prior art there is no relation between the width of the prong and the wavelength of the wave emitted at the resonance frequency f of the prong.

In FIG. 2, the wavelength is on the abscissa and the pressure is on the ordinate. In these figures, the width Wb or Wb' of the prong, shown in gray, is superimposed on the sinusoidal acoustic wave at the resonance frequency f of the prong. The acoustic wave represented is flat, to facilitate understanding. If the wave comes from an outside source, the source is far away from the prong and within its bending plane of vibration. If the acoustic wave is generated by the prong in motion, its movements are ignored.

Figure 2A:
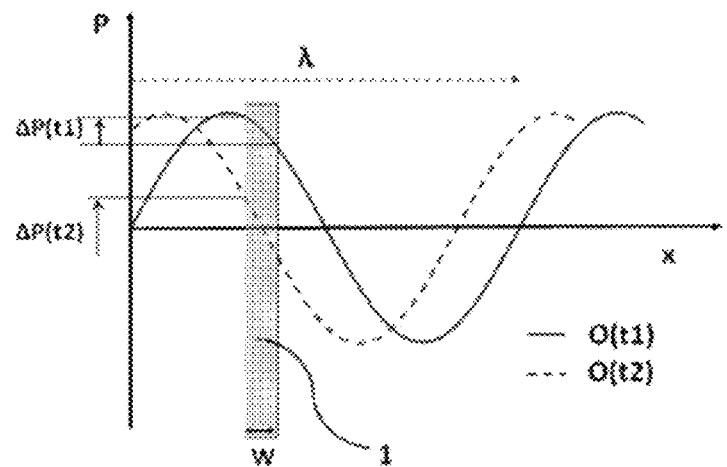
FIG. 2A illustrates the pressure variation ΔP existing between the two edges of a prong of width Wb of the resonator of FIG. 1.
Figure 2B:
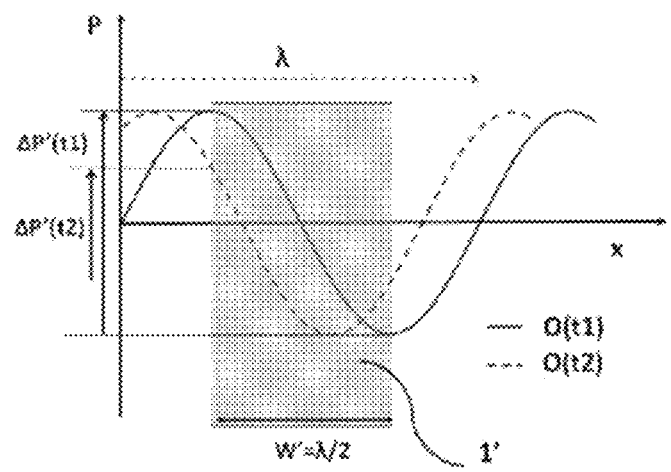
FIG. 2B illustrates the pressure variation ΔP existing between the two edges of a prong of width Wb' of a resonator according to the invention.

In the general case shown in FIG. 2A, the pressure variation ΔP between the edges of the prong in relation to its width is small. In contrast, in the case of the invention, illustrated in FIG. 2B, the pressure variation ΔP' between the edges of the prong, separated by a distance equal to half the wavelength, is maximized because the pressure variations on each edge are in phase opposition.

In the case of an external source, the incident wave creates a force on an edge of equal amplitude and of opposite sign to the force applied to the other edge, which results in the two forces being additive in an optimum manner for exciting the bending vibration mode of the prong.

Generally, the acoustic wave is not flat and it is not possible to obtain forces in phase opposition on the surface of the two edges of the prong. Under these conditions, the width Wb is between $\lambda/4+\eta\lambda$ and $3\lambda/4+\eta\lambda$, n being a positive integer or zero.

These dimensions also apply in the case where it is the prong which generates the acoustic wave. The width dimension so defined increases the acoustic coupling of the prong with the surrounding fluid.

Moreover, the performance of a resonator according to the invention has been improved by limiting the energy losses of the other two types: viscous losses and losses into the support.

To limit the viscous losses of an optimized prong resonator of the invention, the length Lb' of the prong is an important parameter because it determines the resonance frequency. The fundamental bending mode makes it possible to obtain one of the best quality factors.

For an embedded prong, the slenderness ratio varies with the component material and the surrounding fluid.

Figure 3A:
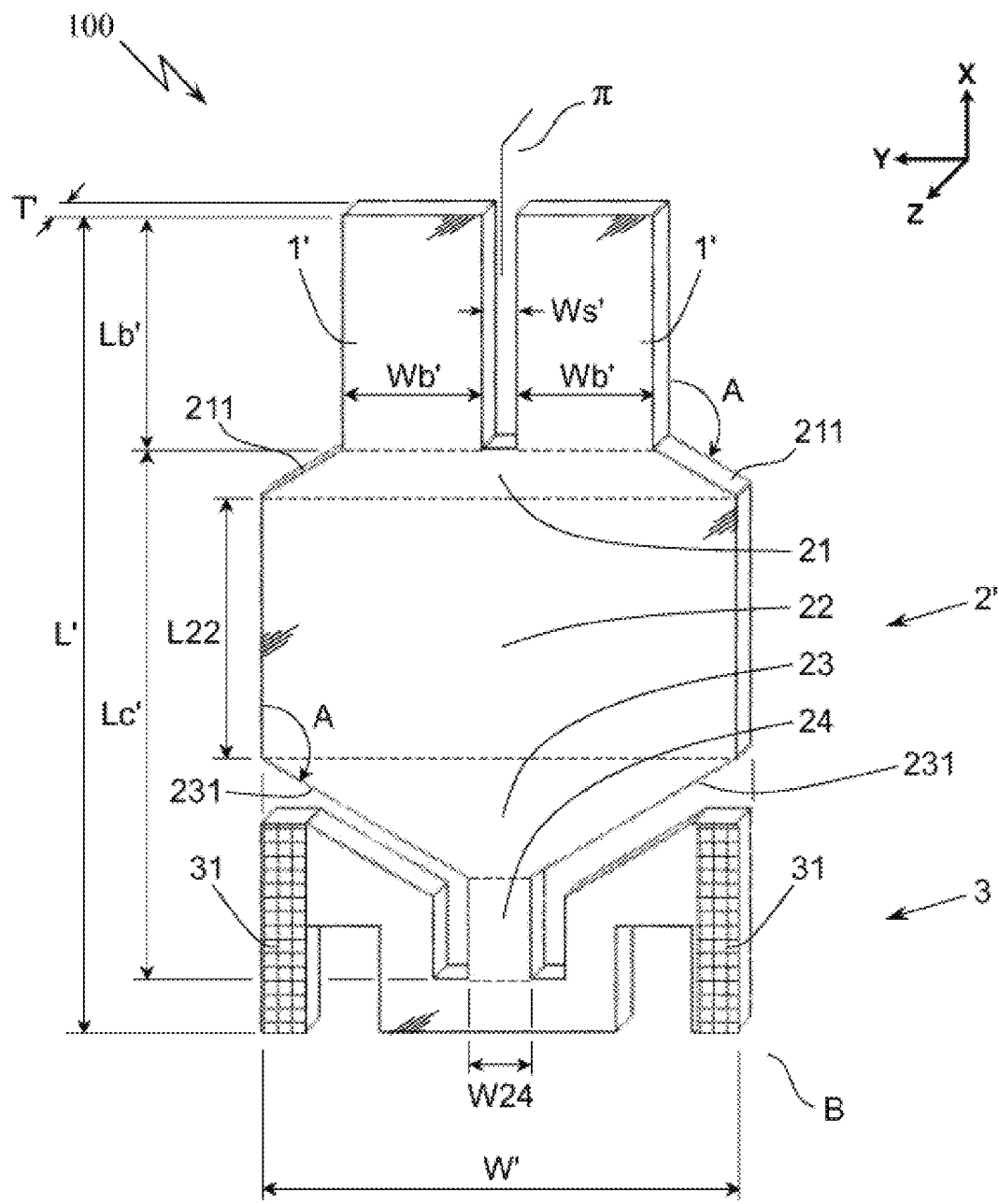
FIG. 3A illustrates a tuning fork according to the invention, comprising two prongs of width Wb'.

The optimized slenderness ratios for a prong embedded at one of its ends, as shown in FIG. 3A, for quartz and silicon in air, helium, hydrogen, oxygen, and carbon dioxide are shown in the table below:

|  | $CO_2$ | $O_2$ | Air | He | $H_2$ |
|---|---|---|---|---|---|
| Quartz | 2.6 | 2.4 | 2.3 | 1.4 | 1.2 |
| Silicon | 3.2 | 2.9 | 2.8 | 1.7 | 1.45 |

The thickness T' of the prong is about a quarter of the width Wb' of the prong.

For a prong embedded at both ends, the slenderness ratio is between 2 and 5 depending on the material and the nature of the fluid.

To limit losses into the support, it is known that the performance of a single prong is not as good as that of a tuning fork. The latter type of resonator has therefore been analyzed for use in the context of the invention.

The low slenderness ratio of the prongs according to the invention alters the nature of the stresses at the embedding area on the shared portion fixed to the support.

In particular, there are high shear stresses in the embedding area.

This results in a specific conformation of the tuning fork of the invention, illustrated in FIG. 3A, which significantly increases the contribution of the shared portion to the vibration of the resonator and to the detection of said vibration.

For this embodiment, the frequency is 42,500 Hz, which is a wavelength of 8 mm in air under normal pressure conditions, the material used being quartz in the form of a machined flat plate of dimensions L'=23.75 mm, meaning 2.97$\lambda$, by W'=13.8 mm, meaning 1.72$\lambda$, and of thickness T'=1 mm, meaning $\lambda/8$.

The plane of the plate is substantially parallel to the crystallographic XY plane of the quartz, and the longitudinal axes of the arms 1' are substantially parallel to the crystallographic X-axis of the quartz (unlike the timepiece tuning fork shown in FIG. 1A, in which the arms are substantially parallel to the crystallographic Y-axis of the quartz). The tuning fork 100 is symmetrical about a plane $\pi$ perpendicular to the plane of the plate.

The tuning fork 100 is formed of two identical and substantially parallelepipedic arms 1' of length Lb'=6.8 mm, meaning 0.85$\lambda$, and width Wb'=4 mm, meaning 0.5$\lambda$, each integral at one end with a shared portion 2' consisting of four areas 21, 22, 23, 24 bounded by dotted lines.

The shared portion 2' is integral with a mounting arm 3 at the area 24 opposite to the area 21 integral with the two arms.

The connection area 21 between the arms 1' and the main portion 22 of the shared portion 2' has an isosceles trapezoidal shape in which the outwardly facing edges 211 connect the outer edges of the arms to the edges of the main shared portion 22 with an inclination of angle A substantially equal to 120° relative to the X axis (which, in the case where the tuning fork is created by chemical machining, prevents the formation of oblique facets on said edges). The height of this trapezoid is about 1.4 mm.

Similarly, area 23 which connects areas 22 and 24 of the shared portion 2', has an angle of 120° relative to the crystallographic X-axis of the quartz. The height of the trapezoid is about 3.5 mm.

The tuning fork 100 is fixed to a housing base B (not shown), for example by bonding, at surfaces 31 (indicated with hatching) of the mounting arm 3.

The thickness T' of the plate and the width of the slot Ws' are substantially equal to 1 mm, which is $\lambda/8$. In general, the thickness T' and the distance W' are close, meaning that the distance Ws' may be comprised between 0.5 and 2 times the thickness T' of the plate.

The shared portion 2' is integral with the two arms at the connection area 21 which connects the arms to the area 22 of rectangular shape, and its dimension W' perpendicular to plane $\pi$ is greater than the width (2Wb'+Ws') containing the two arms: W' is substantially 1.5 times (2Wb'+Ws'). Furthermore, dimension L22 of area 22 taken parallel to the X axis is substantially half the length Lc' of the shared portion 2'. For example, Lc' is 15.45 mm, which is 1.93$\lambda$, and L22 is 7.6 mm, which is 0.95$\lambda$.

The width W24 of area 24 is much less than W': W24 is substantially equal to 1.6 mm, which is $\lambda/5$.

Under these conditions, the surface area of the shared portion 2' is about three times the total surface area 2·Lb'·Wb' of the two arms 1'. For the tuning fork of the invention, the mass of material in the shared portion is therefore significantly greater than that in the two arms, unlike the case of the timepiece tuning fork.

Figure 3B:
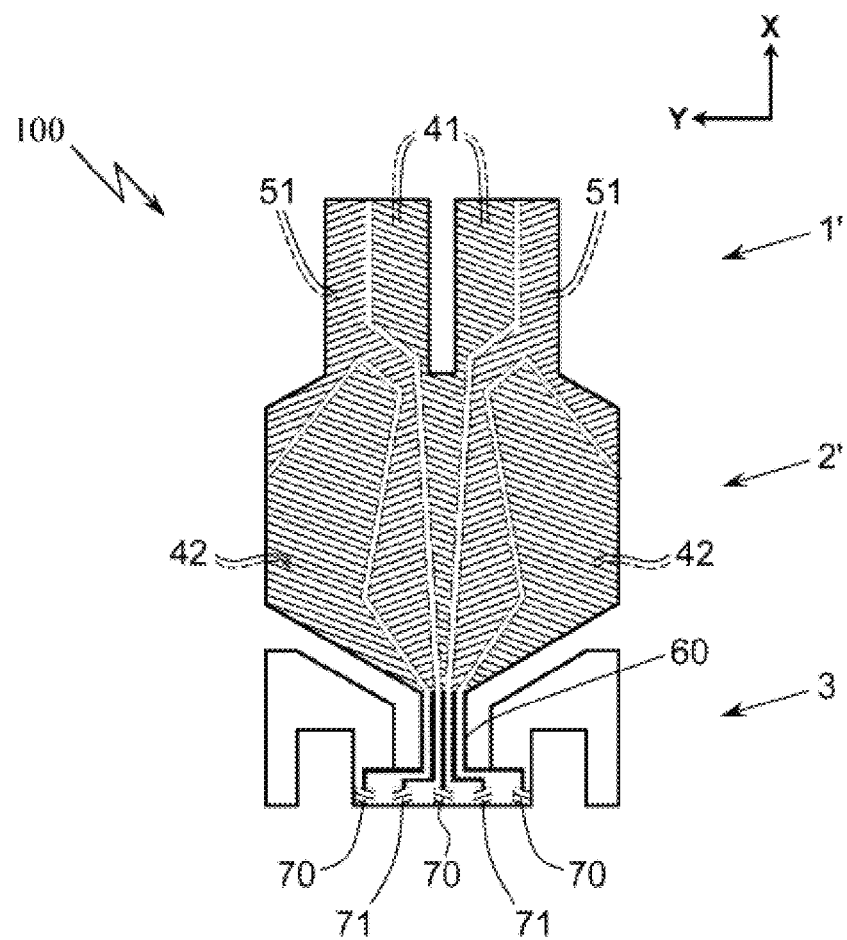
FIG. 3B illustrates an optimized conformation of electrodes for detecting a tuning fork optimized according to the invention.

FIG. 3B shows a front view of the electrodes equipping the resonator 100 of FIG. 3A and enabling, by piezoelectric effect, detection of the vibration of the resonator. The electrodes are in the form of conductive pads 41, 42, and 51, represented by hatched areas, arranged on the two large faces of the plate, and acting in the arms 1' and in the shared portion 2'. Electrodes 41 and 42 have the same electrical polarity, different from the polarity of electrode 51. The electrodes 41, 42, and 51 arranged on one of the large faces are directly opposite the electrodes 41, 42 and 51 arranged on the other large face (indicated with a reference dotted line), and each of the electrodes has the same electrical polarity as the electrode arranged directly opposite on the other large face.

The relatively complex shapes of the electrodes 41, 42 and 51 result from numerical simulations with finite elements and are related to the relatively complex distribution of mechanical stresses generated by the vibration of the tuning fork, these stresses being of three types: expansion/compression stress $T_{XX}$ along the X axis, expansion/compression stress $T_{YY}$ along the Y axis, and shear stress $T_{XY}$ in the XY plane. The conformation of the electrodes is characteristic in that they concern the prongs equally in the conventional manner, but the shared portion 2' as well.

Electrodes 41, 42 of the same polarity and electrodes 51 are connected to respective connecting pads 70 and 71 located on the mounting arm 3, by means of connecting tracks of the type denoted 60.

Thus, the connecting pads 70 and 71 respectively connect the two polarities of all the electrodes, the tuning fork equipped with its electrodes constituting a dipole piezoelectrically linked to vibration.

It is possible to detect the vibration of the tuning fork, for example by connecting the pads 70 and 71 to a differential charge amplifier (not shown) which generates for example a voltage representative of the amplitude of the vibration. Note that the electrodes shown in FIG. 3B, arranged only on the two large faces of the plate, are well suited for low-cost manufacturing. For example, when the resonator structure is obtained by chemical etching of a quartz wafer, the electrodes can easily be created by etching metal masks on the front and back which were previously used for etching chemically the quartz.

The invention aims to provide a resonator for use in a fluid. However, the resonator described has significant acoustic losses, which is not favorable in this state for obtaining a high overall quality factor.

To obtain a device optimized according to the invention and having a high quality factor, a means must be added to the resonator described above which is able to restore substantially all acoustic energy losses due to its coupling with the fluid.

The role of the means able to restore the acoustic energy or the containment means is to return to the resonator the acoustic waves emitted by the resonator in order to create a new excitation force which then contributes to the vibration.

The containment means of the invention is a resonant acoustic cavity. The resonator is placed at the heart of the resonant acoustic cavity, which is in the form of a hollow cavity. It is known that any hollow cavity offers the phenomenon of acoustic resonance. Therefore natural acoustic resonance modes exist within the cavity, and each is associated with a resonance frequency and a quality factor. These three parameters can for example be calculated for any shape by finite-element simulation software.

The acoustic cavity according to the invention, associated with the mechanical resonator in bending, is characterized in that:

it has a natural frequency of acoustic resonance near or equal to the natural frequency of mechanical resonance of the tuning fork.

the natural acoustic resonance mode, corresponding to the natural frequency of acoustic resonance of the preceding paragraph, has nodes and antinodes according to the position within the cavity. The antinodes can correspond either to overpressures (+) or underpressures (−). Most of the surface area of the two inner edges must be within antinodes of the same sign, meaning either an overpressure or an underpressure. Most of the surface area of the two outer edges must also be located within antinodes of the same sign, but of a sign opposite to those of the inner edges.

the acoustic quality factor of the mode described above must be maximized. For example, the material used to make the walls of the cavity must be rigid.

A mechanical resonator according to our invention is therefore coupled quite well to this acoustic mode in that its dimensions are compatible with the acoustic wavelength, and therefore with the spatial distribution of the pressure mode (where the distance between successive antinodes is precisely equal to $\lambda/2$).

A simplified illustration is shown in FIG. 4A, where the overpressure antinodes (+) and the underpressure antinodes (−) of the resonant acoustic mode are plotted. The wave represented does indeed possess this property of having an underpressure for the two inner edges of the tuning fork, and an overpressure for the two outer edges.

Another illustration in FIG. 4B shows the same principle for a cylindrical cavity formed with a circular directrix of radius $\lambda$, in a front view at the same scale as that of the sensor. The acoustic mode is then radial and one can clearly see that the edges mostly occupy areas with the appropriate signs.

FIG. 4C shows a top view of the same cavity.

The typical quality factors of tuning fork resonators in a fluid, respectively of the timepiece type, of the type according to the invention alone, and of the optimized type, are summarized in the following table with the corresponding overall quality factors:

|  | $Q_s$ | $Q_v$ | $Q_a$ | $Q_g$ |
|---|---|---|---|---|
| Timepiece | 80 000 | 10 000 | 2 000 000 | 8850 |
| Invention | 400 000 | 100 000 | 7 000 | 6437 |
| Optimized | 400 000 | 100 000 | 400 000 | 66 667 |

The quality factor that penalizes timepiece resonators is the viscous damping related to the small dimensions required for such applications. The quality factor is proportional to the surface area/volume ratio.

The tuning fork resonator of the invention offers many improved viscous and support quality factors compared to timepiece tuning forks, but as desired its acoustic quality factor is greatly degraded.

The acoustic quality factor of the optimized device comprising a resonator of the invention is very high due to the cooperation between resonator and resonant cavity.

The optimized device has, as is desirable, high quality factors of similar values, meaning within a range of 1 to 4 compared to a range of 1 to 200 for a timepiece tuning fork of the prior art.

The invention claimed is:

1. A mechanical resonator (100), comprising:
   a flat plate of a material of thickness T', said plate having a shared portion (2') on which is embedded at least one parallelepipedic prong (1') of length Lb' and width Wb', said length Lb' and width Wb' being measured parallel to the plate,
   said prong having a resonance mode with bending in a plane of the plate at a frequency f, at which an acoustic wave is emitted of wavelength $\lambda$ in a fluid in contact with and surrounding the prong,
   wherein electrodes are arranged on said prong, and
   wherein the width Wb' is correspondent to the wavelength $\lambda$ in the fluid such that the width Wb' is between $\lambda/4+n\lambda$ and $3\lambda/4+n\lambda$, n being a positive integer or zero,
   wherein the prong is embedded at both ends thereof, and
   wherein the resonance mode is the fundamental mode with bending, a ratio of the length Lb' of the prong to the width Wb' of the prong being between 2 and 5.

2. The resonator according to claim 1, wherein the width Wb' is equal to $\lambda/2+n\lambda$.

3. A device comprising a mechanical resonator (100) according to claim 1, and an acoustic containment means arranged near the resonator and arranged to reflect acoustic energy emitted by the resonator.

4. A device comprising a mechanical resonator (100) according to claim 2, and an acoustic containment means arranged near the resonator and arranged to reflect acoustic energy emitted by the resonator.

5. A mechanical resonator (100), comprising:
a flat plate of a material of thickness T', said plate having a shared portion (2') on which is embedded at least one parallelepipedic prong (1') of length Lb' and width Wb', said length Lb' and width Wb' being measured parallel to the plate,
said prong having a resonance mode with bending in a plane of the plate at a frequency f, at which an acoustic wave is emitted of wavelength λ in a fluid in contact with and surrounding the prong,
wherein electrodes are arranged on said prong, and
wherein the width Wb' is correspondent to the wavelength λ in the fluid such that the width Wb' is between $\lambda/4+n\lambda$ and $3\lambda/4+n\lambda,$ n being a positive integer or zero,
wherein the prong is embedded at only one end thereof, and
wherein the resonance mode is the fundamental mode with bending,
a ratio of the length Lb' of the prong to the width Wb' of the prong being between 1.2 and 3.2.

6. The resonator according to claim 5, wherein the prong is a first prong arranged in parallel with a second prong having a same form as the first prong, said first and second prongs together forming a tuning fork, embedded in the shared portion (2'), the shared portion (2') having a mass comprised between 2 and 4 times that of said first and second prongs.

7. The resonator according to claim 6, wherein the shared portion (2') has a shape of a rectangular parallelepiped 22 with a length W' that is more than twice the width Wb' of each of said first and second prongs (1') and with a height (L22) that is greater than the length Lb' of each of said first and second prongs,
two isosceles trapezoids (21, 23) arranged one on either side of the parallelepiped, large bases of each of said two isosceles trapezoids having a length equal to the length of the shared portion,
the first and second prongs (1') arranged in parallel at a distance Ws' between 0.5 and 2 times the thickness T' of the plate being embedded in a small base of a first of the isosceles trapezoids (21), outer edge faces of the first and second prongs being coincident with ends of said small base of the first isosceles trapezoid, a small base of a second isosceles trapezoid (23) supporting an intermediate connection member (24) connecting the resonator to a support, a length of said small base of the second isosceles trapezoid being less than half the width Wb' of one of the first and second prongs.

8. The resonator according to claim 7, wherein the electrodes are arranged on faces of each of said first and second prongs (1') and of the shared portion (2') which are parallel to the plane of the plate, of which the electrodes occupy an entire surface except for inter-electrode insulation areas,
said insulation areas occupying less than 20% of a total surface area of said faces parallel to the plane of the plate.

9. The resonator according to claim 8, wherein the electrodes of a face parallel to the plane of the plate comprise:
a Y-shaped central electrode (41) having two symmetrical arms running alongside inner edge faces of the prongs (1') that face one another, and having a tail connecting a central point of the intermediate connection member (24),
two symmetrical external electrodes (42) which each cover at least 25% of a portion of the face parallel to the plane of the plate that is part of the shared portion (2'), each in a lateral area opposite to said shared portion, and which each connect a respective external point of the intermediate connection member, and
two symmetrical intermediate electrodes (51), each having
an arm running alongside an outer edge face of one of the prongs,
a return portion which surrounds an end of one of the external electrodes opposite to the intermediate connection member, and
a tail connecting a respective intermediate point of the intermediate connection member, between the central point and one of the external points.

10. A device comprising a mechanical resonator (100) according to claim 6, and an acoustic containment means arranged near the resonator and arranged to reflect acoustic energy emitted by the resonator.

11. The device according to claim 10, wherein the acoustic containment means is an acoustic cavity resonating at the mechanical resonance frequency of the tuning fork, the acoustic resonance mode of the cavity having nodes and antinodes such that each of the two inner edge faces of the prongs of the resonator is located at a central antinode and such that each of the two outer edge faces of the prongs is located at antinodes in phase opposition to the central antinode.

12. A device comprising a mechanical resonator (100) according to claim 7, and an acoustic containment means arranged near the resonator and arranged to reflect acoustic energy emitted by the resonator.

13. A device comprising a mechanical resonator (100) according to claim 8, and an acoustic containment means arranged near the resonator and arranged to reflect acoustic energy emitted by the resonator.

14. A device comprising a mechanical resonator (100) according to claim 5, and an acoustic containment means arranged near the resonator and arranged to reflect acoustic energy emitted by the resonator.

15. The resonator according to claim 5, wherein the width Wb' is equal to $\lambda/2+n\lambda$.

16. A device comprising a mechanical resonator (100) according to claim 15, and an acoustic containment means arranged near the resonator and arranged to reflect acoustic energy emitted by the resonator.

* * * * *